United States Patent
Paek et al.

(10) Patent No.: US 8,822,249 B2
(45) Date of Patent: Sep. 2, 2014

(54) LIGHT-EMITTING DEVICE AND METHOD OF MANUFACTURING THE SAME

(75) Inventors: Ho-sun Paek, Gyeonggi-do (KR); Hak-hwan Kim, Gyeonggi-do (KR); Sung-kyong Oh, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/436,523

(22) Filed: Mar. 30, 2012

(65) Prior Publication Data
US 2012/0248408 A1 Oct. 4, 2012

(30) Foreign Application Priority Data
Mar. 30, 2011 (KR) ........................ 10-2011-0029029

(51) Int. Cl.
*H01L 21/18* (2006.01)
*H01L 21/301* (2006.01)
*H01L 21/311* (2006.01)

(52) U.S. Cl.
USPC .................. 438/46; 438/22; 438/29; 438/33; 438/42

(58) Field of Classification Search
USPC .......... 257/13, 86, 95, 99, 100, 103, E33.008, 257/E33.012, E33.013, E33.023, E33.025, 257/E33.026, E33.028, E33.044, E33.045, 257/E33.055–E33.065; 438/22, 29, 33, 42, 438/44
See application file for complete search history.

(56) References Cited

U.S. PATENT DOCUMENTS

| | | | |
|---|---|---|---|
| 7,329,905 B2 | 2/2008 | Ibbetson et al. | |
| 7,361,521 B2* | 4/2008 | Oh et al. | 438/46 |
| 7,786,498 B2* | 8/2010 | Choi et al. | 257/98 |
| 7,982,234 B2* | 7/2011 | Seo et al. | 257/98 |
| 8,004,006 B2* | 8/2011 | Nakahara et al. | 257/99 |
| 8,039,371 B2* | 10/2011 | Bedell et al. | 438/481 |
| 8,063,407 B2* | 11/2011 | Choi et al. | 257/79 |
| 8,242,530 B2* | 8/2012 | Seo et al. | 257/98 |
| 8,569,772 B2* | 10/2013 | Kim | 257/82 |
| 2007/0042520 A1* | 2/2007 | Oh et al. | 438/46 |
| 2010/0006881 A1* | 1/2010 | Seo et al. | 257/98 |
| 2011/0012164 A1* | 1/2011 | Kim | 257/99 |
| 2011/0140078 A1* | 6/2011 | Hsu | 257/13 |

FOREIGN PATENT DOCUMENTS

KR 10-0649642 11/2006
KR 10-2010-0035846 4/2010

* cited by examiner

*Primary Examiner* — Fernando L Toledo
*Assistant Examiner* — Christine C Lau
(74) *Attorney, Agent, or Firm* — McDermott Will & Emery LLP

(57) ABSTRACT

A light-emitting device and a method of manufacturing the same are provided. The light-emitting device includes a compound semiconductor structure having a first N-type compound semiconductor layer, an active layer, and a P-type compound semiconductor layer, a P-type electrode layer that is disposed on the P-type compound semiconductor layer and electrically connects with the P-type compound semiconductor layer, a plurality of insulation walls disposed at two sides of the compound semiconductor structure and the P-type electrode layer, a plurality of N-type electrode layers penetrating the plurality of insulation walls, and a conductive substrate on which a plurality of N-type electrode connecting layers respectively corresponding to a plurality of N-type electrode layers are separated from a P-type electrode connecting layer corresponding to the P-type electrode layer.

10 Claims, 8 Drawing Sheets

US 8,822,249 B2

LIGHT-EMITTING DEVICE AND METHOD OF MANUFACTURING THE SAME

CROSS-REFERENCE TO RELATED APPLICATIONS

This application claims the benefit of Korean Patent Application No. 10-2011-0029029, filed on Mar. 30, 2011, in the Korean Intellectual Property Office, the disclosure of is are incorporated herein in its entirety by reference.

BACKGROUND

1. Field

The present disclosure relates to a light-emitting device and a method of manufacturing the same.

2. Description of the Related Art

A light-emitting device such as a light-emitting diode (LED) is used as a semiconductor light source with a pn junction of compound semiconductors and emits different light colors.

For example, a nitride-based LED made of group III-V compounds such as gallium nitride (GaN), indium nitride (InN), and aluminum nitride (AlN) may be widely used as a light-emitting device that emits short-wavelength light (ultraviolet light and green light), and in particular, blue light. Light-emitting devices provide a long lifespan, a compact and lightweight design, and low-voltage driving due to the high directivity of light emitted thereby. Furthermore, light-emitting devices are highly resistant to shock and vibration and do not require preheating or complex driving. They may also be packaged into different shapes and sizes and may be widely used in various applications.

As an approach to fabrication of a light-emitting device such as an LED, a vertical structure has been proposed. This approach includes stacking compound semiconductor layers on an insulating substrate such as a sapphire substrate that is known to best satisfy lattice matching conditions for crystal growth and removing the insulating substrate. Such vertical light-emitting devices are classified into light-emitting devices in which p- and n-electrodes are disposed on the same surface of a compound semiconductor structure and light-emitting devices in which n- and p-electrodes are disposed on the opposite surfaces thereof. A light-emitting device in which the n- and p-electrodes are disposed on the same surface of a compound semiconductor structure may provide better current spreading performance while reducing the drawback of blocking the propagation of light due to the presence of the electrodes.

Conventionally, when electrodes are formed on a compound semiconductor layer and a substrate, an electrode material is covered with an insulating material in order to have electrical insulation between the electrodes having opposite polarities. Furthermore, the manufacturing process of a wafer-level chip size package includes forming an insulating material and depositing a conductive material on the insulating material in order to provide an electrical conduction between a substrate and a compound semiconductor layer. This may cause misalignment, resulting in a high failure rate. This approach may also require a space adjacent to a compound semiconductor layer for forming an insulating layer and depositing a conductive material thereon, thereby decreasing a light-emitting area compared to the area of the compound semiconductor layer.

SUMMARY

Provided are a light-emitting device and a method of manufacturing the same, which simplify fabrication processes and reduce electrical conduction between electrode materials having opposite polarities by allowing the electrode materials to pass through a deposited insulating material.

Additional aspects will be set forth in part in the description which follows and, in part, will be apparent from the description, or may be learned by practice of the presented embodiments.

According to an aspect of the present invention, a light-emitting device includes: a compound semiconductor structure having a first N-type compound semiconductor layer, an active layer, and a P-type compound semiconductor layer; a P-type electrode layer that is disposed on the P-type compound semiconductor layer and electrically connects with the P-type compound semiconductor layer; a plurality of insulation walls disposed at two sides of the compound semiconductor structure and the P-type electrode layer; a plurality of N-type electrode layers penetrating the plurality of insulation walls; and a conductive substrate in which a plurality of N-type electrode connecting layers respectively corresponding to the N-type electrode layers are separated from a P-type electrode connecting layer corresponding to the P-type electrode layer.

According to another aspect of the present invention, a light-emitting device includes: a compound semiconductor structure having a first N-type compound semiconductor layer, an active layer, and a P-type compound semiconductor layer; a P-type electrode layer that is disposed on the P-type compound semiconductor layer and electrically connects with the P-type compound semiconductor layer; an insulation wall formed in middle portions of the compound semiconductor structure and the P-type electrode layer; an N-type electrode layer passing through the insulation wall; and a conductive substrate on which an N-type electrode connecting layer corresponding to the N-type electrode layer is separated from a plurality of P-type electrode connecting layers corresponding to the P-type electrode layer.

According to another aspect of the present invention, a method of manufacturing a light-emitting device includes: forming a plurality of insulation walls on a substrate; forming a compound semiconductor structure and a P-type electrode layer in an interior space defined by the plurality of insulation walls; forming corresponding N-type electrode layers in the plurality of insulating walls; and attaching a conductive substrate on which a plurality of N-type electrode connecting layers are separated from a P-type electrode connecting layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
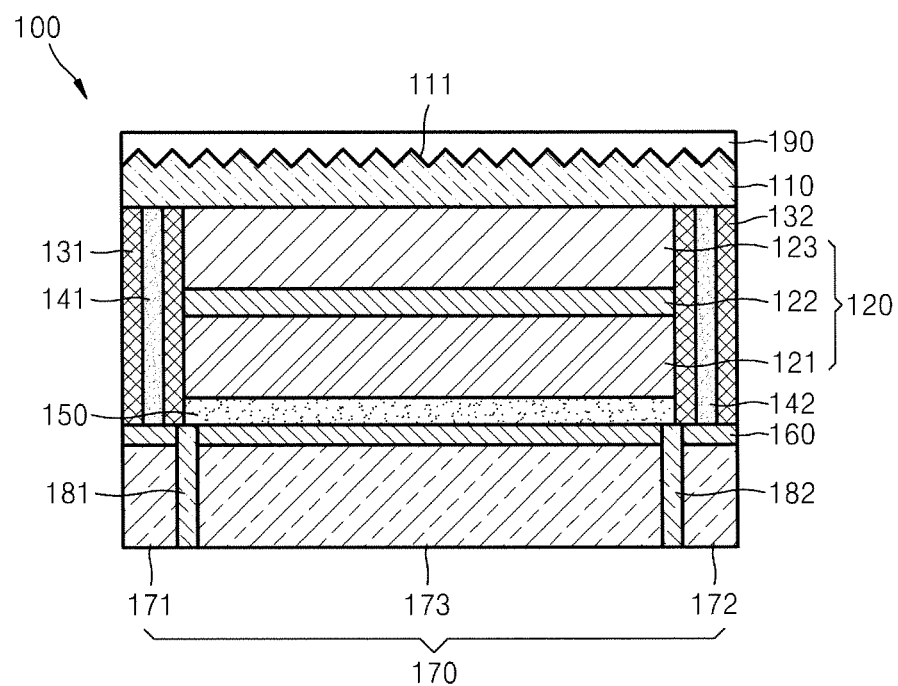
FIG. 1 is a cross-sectional view of a light-emitting device according to an embodiment of the present invention.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a cross-sectional view of a light-emitting device 100 according to an embodiment of the present invention.

Referring to FIG. 1, the light-emitting device 100 according to the present embodiment includes a compound semiconductor structure 120, insulation walls 131 and 132 formed at either side of the compound semiconductor structure 120, and an electrode structure.

The compound semiconductor structure 120 includes a P-type compound semiconductor layer 121 grown on a predetermined substrate (101 in FIG. 4), an active layer 122, and a first N-type compound semiconductor layer 123. The substrate 101, serving as a base for crystal growth, may be removed as described below.

For example, the compound semiconductor structure 120 may be a nitride semiconductor diode formed by growing group III-V compound semiconductor crystals such as GaN, InN, and AlN. Such a nitride semiconductor diode may be manufactured using an insulating substrate such as sapphire substrate that satisfies lattice matching conditions for crystal growth. The P-type compound semiconductor layer 121 has a P-type conductivity and the first N-type compound semiconductor layer 123 has an N-type conductivity. Depending on the application, the P-type and the N-type compound semiconductor layers 121 and 123 may have different conductivities than those described above.

The active layer 122 is disposed between the P-type and the first N-type compound semiconductor layers 121 and 123. The active layer 122 may have a multiple-quantum-well (MQW) structure. The MQW structure consists of a plurality of quantum well layers and a plurality of quantum barrier layers intervened between the plurality of quantum well layers. For example, when the compound semiconductor structure 120 is a GaN LED, the P-type compound semiconductor layer 121 may be formed of GaN doped with P-type impurities. The first N-type compound semiconductor layer 123 may be formed of GaN doped with N-type impurities. The active layer 122 may be formed by alternately stacking indium gallium nitride (InGaN) quantum well layers and quantum barrier layers.

The insulation walls 131 and 132 are formed at two side edges of the compound semiconductor structure 120. The insulation walls 131 and 132 may be made of a common insulation material such as polyimide.

The electrode structure includes N- and P-type electrode structures.

The N-type electrode structure includes N-type electrode layers 141 and 142, a second N-type compound semiconductor 110 overlying the compound semiconductor structure 120 and the insulation walls 131 and 132, and N-type electrode connecting layers 171 and 172 disposed at two side edges of a conductive substrate 170 that is attached to bottom surfaces of the compound semiconductor structure 120 and the insulation walls 131 and 132 by a conductive adhesive layer 160.

The P-type electrode structure includes a P-type electrode layer 150 contacting a bottom surface of the P-type compound semiconductor layer 121 and a P-type electrode connecting layer 173 disposed between the N-type electrode connecting layers 171 and 172 of the conductive substrate 170.

The N-type electrode connecting layers 171 and 172 are electrically isolated from the P-type electrode layer 173 by partition walls 181 and 182. That is, the partition walls 181 and 182 penetrate the conductive substrate 170 and the conductive adhesive layer 160 so as to contact the insulation walls 131 and 132, respectively. Thus, the N-type electrode structure may be electrically isolated from the P-type electrode structure.

The P-type electrode layer 150 is formed between the insulation walls 131 and 132 so as to contact the bottom surface of the compound semiconductor structure 120 and is not limited thereto. For example, if the P-type electrode layer 150 may be electrically separated from the N-type electrode layers 141 and 142 and the N-type electrical connecting layers 171 and 172 by the partition walls 181 and 182, it may be formed outside of the space between the insulation walls 131 and 132.

A conduction path of the N-type electrode structure includes the N-type electrode connecting layers 171 and 172, the conductive adhesive layer 160, the N-type electrode layers 141 and 142, the second N-type compound semiconductor layer 110, and the first N-type compound semiconductor layer 123.

A conduction path of the P-type electrode structure includes the P-type electrode connecting layer 173, the conductive adhesive layer 160, the P-type electrode layer 150, and the P-type compound semiconductor layer 121.

The second N-type compound semiconductor layer 110 is made of the same material as the first N-type compound semiconductor layer 123 and has a concave-convex structure 111 formed on its top surface. A phosphor layer 190 is applied over the concave-convex structure 111.

Holes and electrons injected through the P-type compound semiconductor layer 121 and the first N-type compound semiconductor layer 123 meet in the active layer 122 to produce light. Light produced from the active layer 122 exits through the second N-type compound semiconductor layer 110 and the phosphor layer 190 that overlie the compound semiconductor structure 120.

Figure 12:
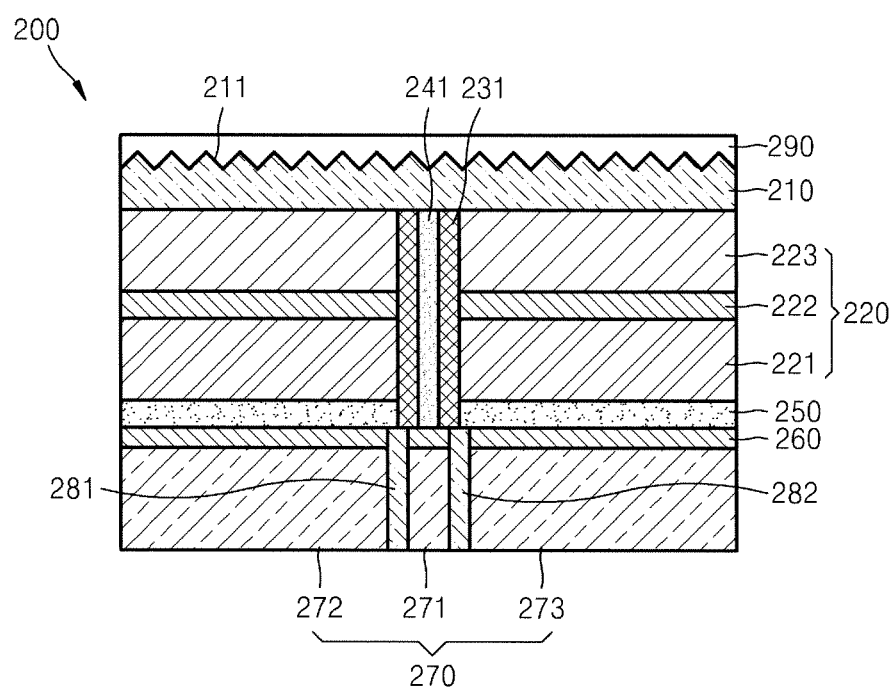
FIG. 12 is a cross-sectional view of a light-emitting device according to another embodiment of the present invention.

In the light-emitting device 100 of FIG. 1 according to the present embodiment, the insulation walls 131 and 132 are formed at either side of the compound semiconductor structure 120 by cutting a portion S1 (see FIG. 3) of a wafer. FIG. 12 is a cross-sectional view of a light-emitting device 200 according to another embodiment of the present invention.

Referring to FIG. 12, the light-emitting device 200 according to the present embodiment includes a compound semiconductor structure 220, an insulation wall 231 formed at a middle portion of the compound semiconductor structure 220, and an electrode structure.

The compound semiconductor structure 220 includes a P-type compound semiconductor layer 221, an active layer 222, and a first N-type compound semiconductor layer 223.

Figure 3:
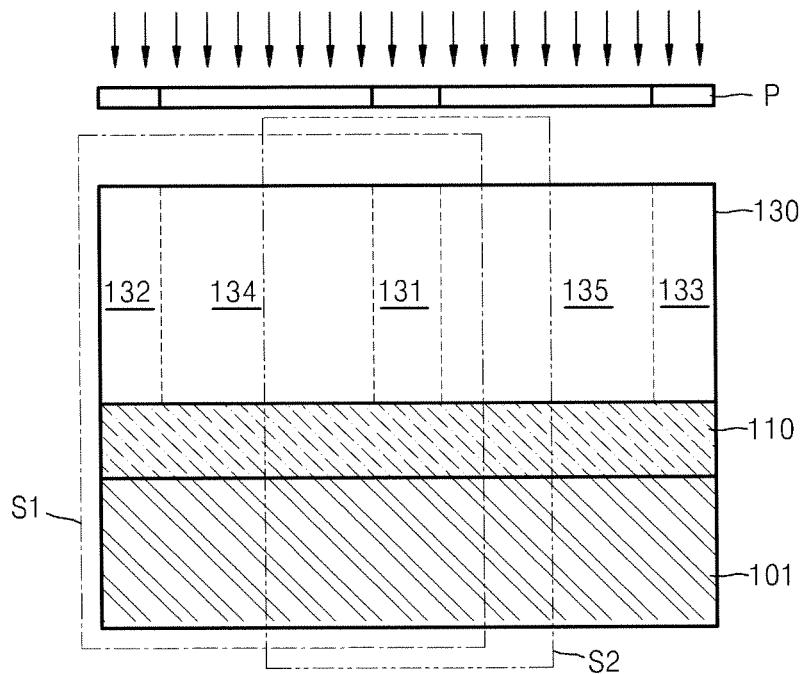

The insulation wall 231 is formed at the middle portion of the compound semiconductor structure 220 by cutting a portion S2 of the wafer shown in FIG. 3.

The electrode structure includes N-type and P-type electrode structures.

The N-type electrode structure includes an N-type electrode layer 241 passing through the inside of the insulation wall 231, a second N-type compound semiconductor 210 overlying the compound semiconductor structure 220 and the insulation wall 231, and an N-type electrode connecting layer 271 disposed at the middle portion of a conductive substrate 270 that is attached to bottom surfaces of the compound semiconductor structure 220 and the insulation wall 231 by a conductive adhesive layer 260.

The P-type electrode structure includes a P-type electrode layer 250 contacting a bottom surface of the P-type compound semiconductor layer 221, and P-type electrode connecting layers 272 and 273 disposed at either side of the N-type electrode connecting layer 271 of the conductive substrate 270.

The N-type electrode connecting layer 271 is electrically separated from the P-type electrode connecting layers 272 and 273 by partition walls 281 and 282. That is, the partition walls 281 and 282 are located at either side of the N-type electrode connecting layer 271 so as to penetrate the conductive substrate 270 and the conductive adhesive layer 260 and contact the insulation wall 231. Thus, the N-type electrode structure may be electrically isolated from the P-type electrode structure.

A conduction path of the N-type electrode structure includes the N-type electrode connecting layer 271, the conductive adhesive layer 260, the N-type electrode layer 241, the second N-type compound semiconductor layer 210, and the first N-type compound semiconductor layer 223.

A conduction path of the P-type electrode structure includes the P-type electrode connecting layers 272 and 273, the conductive adhesive layer 260, the P-type electrode layer 250, and the P-type compound semiconductor layer 221.

The second N-type compound semiconductor layer 210 is made of the same material as the first N-type compound semiconductor layer 223 and has a concave-convex structure 211 formed on its top surface. A phosphor layer 290 is formed over the concave-convex structure 211.

The location of the insulation walls 131 and 132 (231) is not limited to those shown in FIGS. 1 and 12. The insulation walls 131 and 132 (231) may be located at different positions than the side edges or middle portion depending on the cut positions on a wafer.

FIGS. 2 through 11 illustrate a method of manufacturing the light-emitting device 100 of FIG. 1 according to an embodiment of the present invention. Since a method of manufacturing the light-emitting device 200 of FIG. 12 includes the same manufacturing processes as the method described with reference to FIGS. 2 through 11 except for the location of the insulation walls 131 and 132 (231), detailed descriptions thereof will be omitted.

Figure 2:
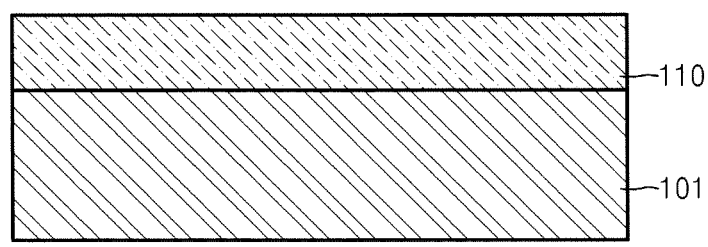
FIGS. 2 through 11 illustrate a method of manufacturing a light-emitting device according to an embodiment of the present invention.

Referring to FIG. 2, the second N-type compound semiconductor layer 110 is formed on the substrate 101. The substrate 101 may be selected suitably for a compound semiconductor with which crystals are to be grown. For example, if a single crystal of a nitride semiconductor is grown, the substrate 101 may be one of a sapphire substrate, a zinc oxide (ZnO) substrate, a gallium nitride (GaN) substrate, a silicon carbide (SiC) substrate, and an aluminum nitride (AlN) substrate.

Referring to FIG. 3, an insulating layer 130 is formed on the second N-type compound semiconductor layer 110 to a predetermined thickness. Then, the insulating layer 130 is covered with a photomask P having a pattern formed at locations corresponding to portions of the insulating layer 130 for forming insulation walls 131, 132, and 133 and irradiated with ultraviolet (UV) rays. Subsequently, spaces between the insulation walls 131 and 132 and between the insulation walls 131 and 133 are etched using a photolithography process. The photolithography process is known in the art and thus its detailed description is omitted.

A method of manufacturing a light-emitting device by selecting the portion 51 of the wafer shown in FIG. 3 will now be described.

Figure 4:
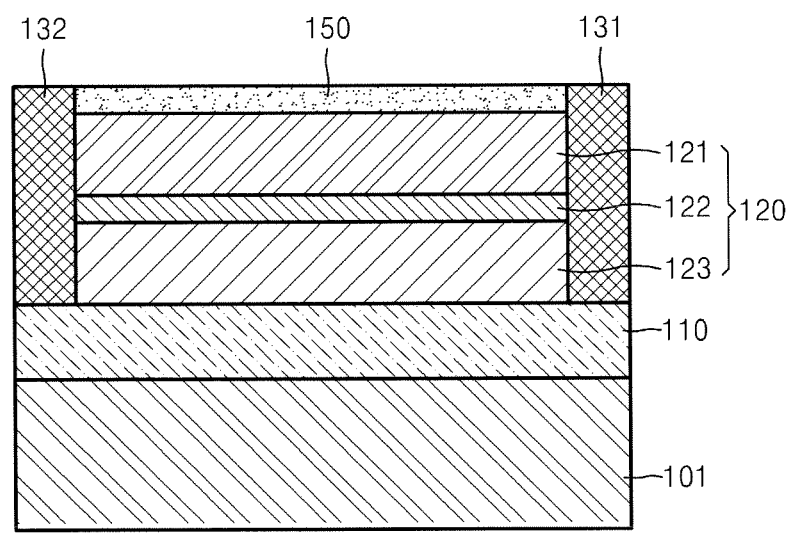

Referring to FIG. 4, in the space (134 in FIG. 3), the first N-type compound semiconductor layer 123, the active layer 122, and the P-type compound semiconductor layer 121 are sequentially grown on the second N-type compound semiconductor layer 110 to form the compound semiconductor structure 120. A P-type electrode layer 150 is then formed on the compound semiconductor structure 120.

The compound semiconductor structure 120 may be formed by growing crystals of a group III-V compound semiconductor such as GaN, InN, or AlN. For example, when the compound semiconductor structure 120 is a GaN LED, the P-type compound semiconductor layer 121, the active layer 122, and the first N-type compound semiconductor layer 123 may be formed of semiconductor materials having a composition expressed by $Al_xIn_yGa_{(1-x-y)}N$ ($0 \leq x \leq 1$, $0 \leq y \leq 1$, $0 \leq x+y \leq 1$) by epitaxial growth using Metal Organic Chemical Vapor Deposition (MOCVD) equipment. That is, the P-type compound semiconductor layer 121 may be formed of GaN or GaN/AlGaN doped with impurities of a second conductivity type such as magnesium (Mg), Zn, or beryllium (Be). The active layer 122 may have an InGaN/GaN MQW structure, or a single quantum well structure or double heterostructure. The first and second N-type compound semiconductor layers 123 and 110 may be formed of GaN or GaN/AlGaN doped with impurities of a first conductivity type such as silicon (Si), germanium (Ge), or tin (Sn).

The P-type electrode layer 150 may be formed by depositing Al/titanium (Ti)/platinum (Pt) layers to thicknesses of 200 nm/1200 nm/20 nm, respectively.

Figure 5:
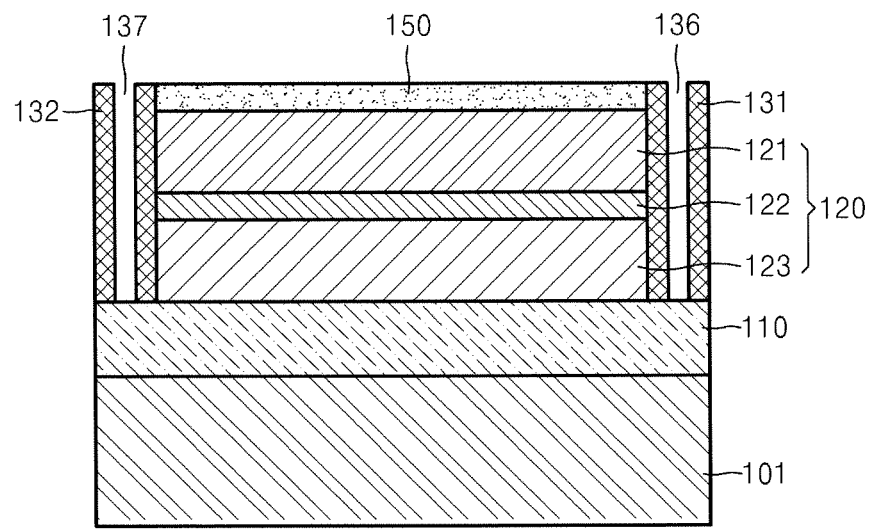

Referring to FIG. 5, holes 136 and 137 penetrate the insulation walls 131 and 132 in such a manner as to expose a portion of the second N-type compound semiconductor layer 110. The holes 136 and 137 may be formed by one of various methods such as mechanical drilling, ultrasonic drilling, laser drilling, sand blasting and dry etching, or a combination of these methods.

Figure 6:
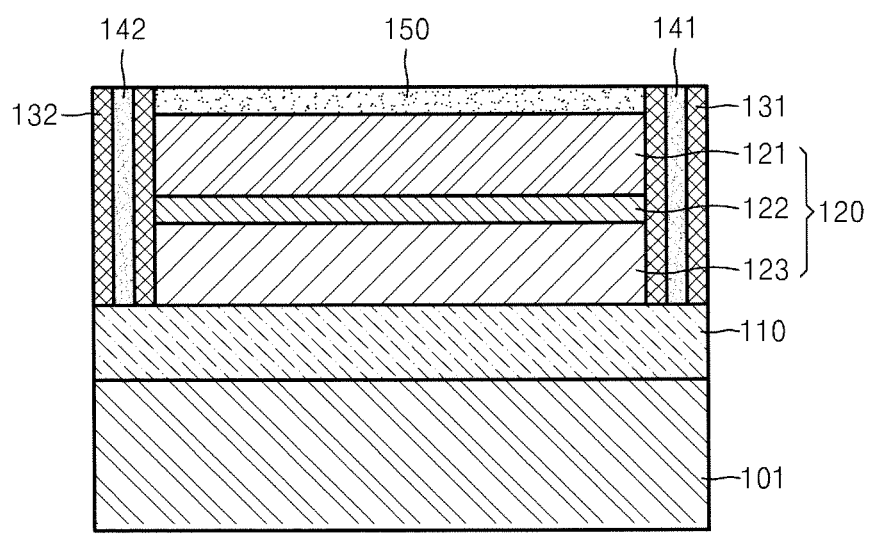

Referring to FIG. 6, the holes 136 and 137 formed in the insulation walls 131 and 132 are filled with a conductive material such as Al/Ti/Pt using sputtering or chemical vapor deposition (CVD) so as to form the N-type electrode layers 141 and 142 that contact the second N-type compound semiconductor layer 110.

Figure 7:
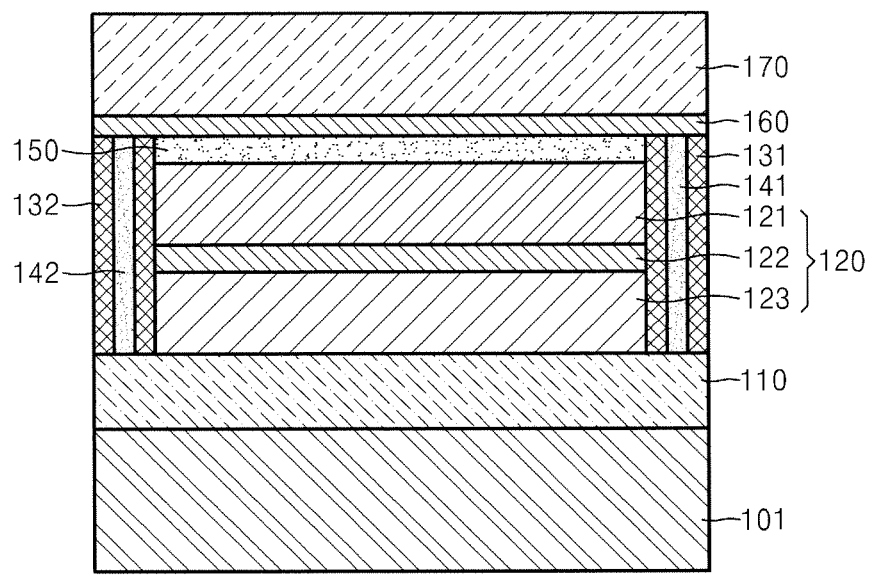

Referring to FIG. 7, the conductive substrate 170 is then attached onto the insulation walls 131 and 132, the N-type electrode layers 141 and 142, and the P-type electrode layer 150 by the conductive adhesive layer 160. At a temperature above 300° C., a predetermined pressure is applied to the conductive adhesive layer 160 so as to attach the conductive substrate 170 onto the conductive adhesive layer 160. The conductive substrate 170 serves as a final support for the light-emitting device 100 and may have a similar thermal expansion coefficient to that of the substrate 101 since the attachment is made at a temperature above 300° C. The conductive substrate 170 may be one of a Si substrate, a gallium arsenide (GaAs) substrate, and a Ge substrate.

Figure 8:
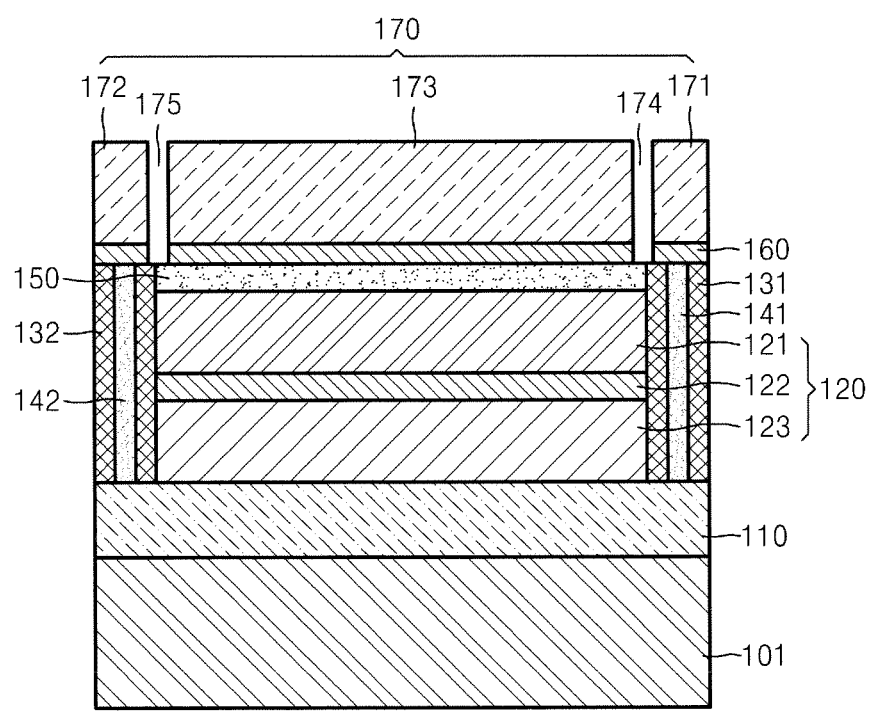
Figure 9:
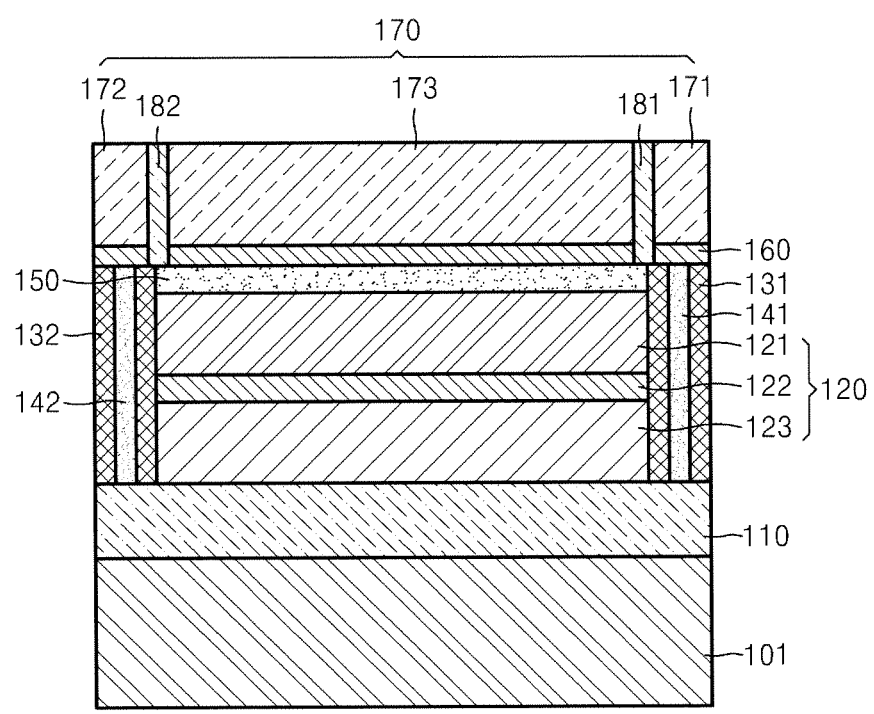

Referring to FIGS. 8 and 9, holes 174 and 175 are formed through the conductive substrate 170 and the conductive adhesive layer 160. The holes 174 and 175 may be formed by one of various methods such as mechanical drilling, ultrasonic drilling, laser drilling, sand blasting and dry etching, or a combination of these methods.

The N-type electrode connecting layers 171 and 172 are separated from the P-type electrode connecting layer 173 by the holes 174 and 175. The holes 174 and 175 are filled with an insulating material such as polyimide using sputtering or CVD so as to form insulating partition walls 181 and 182. In this case, the holes 174 and 175 may expose portions of the insulation walls 131 and 132 so that the insulating partition walls 181 and 182 prevent electrical conductance between the N-type electrode connecting layers 171 and 172 and the P-type electrode connecting layer 173.

The processes described with reference to FIGS. 7 through 9 may be performed in a different order. More specifically, the conductive adhesive layer 160 may be formed on the conductive substrate 170, and the plurality of holes 174 and 175 may be formed through the conductive substrate 170 and the conductive adhesive layer 160. Then, the plurality of holes 174 and 175 may be filled with insulating materials so as to form partition walls 181 and 182 that electrically separate the N-type electrode connecting layers 171 and 172 from the P-type electrode connecting layer 173. Subsequently, the conductive substrate 170 may be attached to the insulation walls 131 and 132, the N-type electrode layers 141 and 142, and the P-type electrode layer 150 so that the N-type electrode connecting layers 171 and 172 respectively correspond to the N-type electrode layers 141 and 142 and the P-type electrode connecting layer 173 corresponds to the P-type electrode layer 150.

Figure 10:
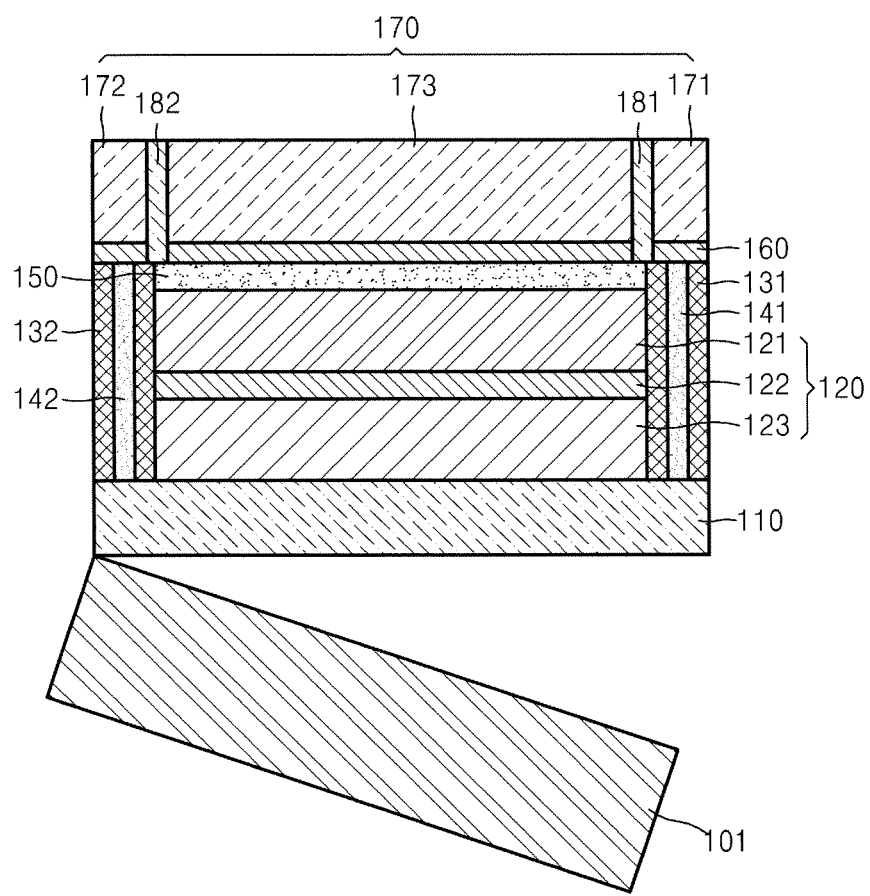
Figure 11:
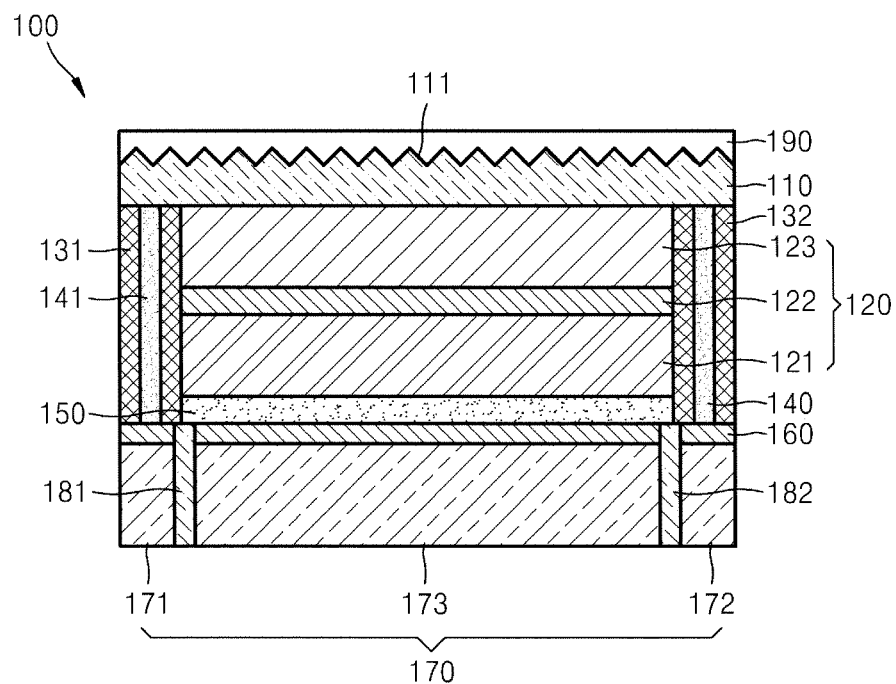

Referring to FIGS. 10 and 11, the substrate 101 is removed from the second N-type compound semiconductor layer 110. The second N-type compound semiconductor layer 110 from which light is extracted may have a concave-convex structure 111 formed on its top surface after removal of the substrate 101 in order to increase light extraction efficiency of the light-emitting device 100. The phosphor layer 190 is formed on the concave-convex structure 111 so as to realize various colors.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a light-emitting device, comprising:
    forming a plurality of insulation walls on a substrate;
    forming a compound semiconductor structure and a P-type electrode layer in an interior space defined by the plurality of insulation walls;
    forming corresponding N-type electrode layers in the plurality of insulating walls; and
    attaching a conductive substrate in which a plurality of N-type electrode connecting layers are separated from a P-type electrode connecting layer,
    wherein the attaching of the conductive substrate comprises:
        penetrating the conductive substrate to form a plurality of holes; and
        filling each of the plurality of holes with an insulating material and forming a plurality of partition walls separating the P-type electrode connecting layer from the plurality of N-type electrode connecting layers.

2. The method of claim 1, wherein the forming of the plurality of insulation walls on the substrate comprises:
    forming a second N-type compound semiconductor layer on the substrate;
    forming an insulating layer on the second N-type compound semiconductor layer; and
    patterning the insulating layer to form a plurality of spaced-apart insulation walls on either side of the substrate.

3. The method of claim 2, wherein the forming of the compound semiconductor structure and the P-type electrode layer comprises sequentially stacking a first N-type compound semiconductor layer, an active layer, and a P-type compound semiconductor layer to form the compound semiconductor structure and forming the P-type electrode layer on the P-type compound semiconductor layer.

4. The method of claim 2, wherein the forming of the corresponding N-type electrode layers in the plurality of insulating walls comprises penetrating the corresponding plurality of insulation walls to form a plurality of holes extending from top surfaces of the plurality of insulation walls to a top surface of the second N-type compound semiconductor layer and filling the plurality of holes with a metallic material.

5. The method of claim 2, wherein the second N-type compound semiconductor layer has a concave-convex structure formed on its top surface.

6. The method of claim 5, further comprising forming a phosphor layer on the concave-convex structure.

7. The method of claim 1, wherein the plurality of insulation walls are formed on the substrate prior to the forming of the compound semiconductor structure and the P-type electrode layer in the interior space defined by the plurality of insulation walls.

8. A method of manufacturing a light-emitting device, comprising:
    forming a plurality of insulation walls on a substrate;
    forming a compound semiconductor structure and a P-type electrode layer in an interior space defined by the plurality of insulating walls;
    forming corresponding N-type electrode layers in the plurality of insulating walls; and
    attaching a conductive substrate in which a plurality of N-type electrode connecting layers are separated from a P-type electrode connecting layer,
    wherein the forming of the corresponding N-type electrode layers in the plurality of insulating walls comprises penetrating the corresponding plurality of insulation walls to form a plurality of holes extending from top surfaces of the plurality of insulation walls to a top surface of a second N-type compound semiconductor layer formed on the substrate and filling the plurality of holes with a metallic material, and
    wherein the attaching of the conductive substrate comprises:
        forming a conductive adhesive layer on the conductive substrate;
        penetrating the conductive substrate and the conductive adhesive layer to form a plurality of holes;
        filling each of the plurality of holes with an insulating material and forming a plurality of partition walls separating the P-type electrode connecting layer from the plurality of N-type electrode connecting layers; and
        attaching the conductive substrate so that the plurality of N-type electrode connecting layers respectively correspond to the plurality of N-type electrode layers and the P-type electrode connecting layer corresponds to the P-type electrode layer.

9. The method of claim 8, wherein the plurality of partition walls contact with the plurality of insulation walls.

10. The method of claim 9, further comprising removing the substrate.

* * * * *